United States Patent
Qin et al.

(10) Patent No.: US 11,655,554 B2
(45) Date of Patent: May 23, 2023

(54) METHOD FOR PREPARING ELECTRODE OF INDUCTIVE COMPONENT

(71) Applicant: SHENZHEN HUALUO ELECTRONICS CO., LTD., Guangdong (CN)

(72) Inventors: Hao Qin, Guangdong (CN); Mingliang Xiang, Guangdong (CN)

(73) Assignee: Dongguan Hualuo Electronics Co., Ltd., Dongguan (CN)

( * ) Notice: Subject to any disclaimer, the term of this patent is extended or adjusted under 35 U.S.C. 154(b) by 0 days.

(21) Appl. No.: 17/120,234

(22) Filed: Dec. 13, 2020

(65) Prior Publication Data

US 2021/0108322 A1    Apr. 15, 2021

Related U.S. Application Data

(63) Continuation of application No. PCT/CN2020/119164, filed on Sep. 30, 2020.

(30) Foreign Application Priority Data

Oct. 9, 2019   (CN) .......................... 201910953506.7

(51) Int. Cl.
  *C25D 5/48* (2006.01)
  *C25D 3/38* (2006.01)
  (Continued)

(52) U.S. Cl.
  CPC .............. *C25D 3/38* (2013.01); *C25D 5/022* (2013.01); *C25D 5/48* (2013.01); *C25D 7/06* (2013.01); *H01L 28/10* (2013.01); *H01L 29/40* (2013.01)

(58) Field of Classification Search
  None
  See application file for complete search history.

(56) References Cited

U.S. PATENT DOCUMENTS

| | | | |
|---|---|---|---|
| 5,788,824 A * | 8/1998 | Catonne | C25D 5/34 205/191 |
| 2006/0219566 A1* | 10/2006 | Cheng | H01L 21/2885 205/123 |

(Continued)

FOREIGN PATENT DOCUMENTS

| | | |
|---|---|---|
| CN | 101079342 A | 11/2007 |
| CN | 101083163 A | 12/2007 |

(Continued)

OTHER PUBLICATIONS

English translation of CN 110098042, 2019. (Year: 2019).*

*Primary Examiner* — Stefanie S Wittenberg
(74) *Attorney, Agent, or Firm* — Winston Hsu

(57) ABSTRACT

A method for preparing an electrode of an inductive component, includes: S1: performing surface insulation treatment, specifically including: placing an inductive component in a tilting and rotating spraying pot, and performing thermal spraying on resin by using a fixed spray gun for surface insulation treatment; S2: exposing an inner electrode, specifically including: processing an electrode area through laser or mechanical polishing to expose the inner electrode; S3: performing surface pretreatment, specifically including: performing degreasing and surface pretreatment with ultrasound in a special solution; S4: performing surface activation treatment, specifically including: performing surface activation treatment with ultrasound in a low-concentration acid solution; S5: electroplating to form a metal layer, specifically including: electroplating to form an electroplated copper layer first, then electroplating to form an electroplated nickel layer, and finally electroplating to form an electroplated tin layer; and S6: performing surface post-treatment.

10 Claims, 2 Drawing Sheets

(51) Int. Cl.
  *C25D 7/06* (2006.01)
  *H01L 49/02* (2006.01)
  *C25D 5/02* (2006.01)
  *H01L 29/40* (2006.01)

(56) References Cited

U.S. PATENT DOCUMENTS

| | | | |
|---|---|---|---|
| 2009/0294293 A1* | 12/2009 | Zahraoui | C25D 3/38 |
| | | | 205/123 |
| 2012/0020836 A1* | 1/2012 | Nojima | G01N 35/1004 |
| | | | 422/69 |
| 2013/0257576 A1 | 10/2013 | Arata | |
| 2014/0008234 A1* | 1/2014 | Wei | H01L 21/02697 |
| | | | 205/91 |
| 2015/0194402 A1* | 7/2015 | Hsu | H01L 24/13 |
| | | | 257/737 |
| 2019/0201675 A1* | 7/2019 | Miller | C25D 1/003 |

FOREIGN PATENT DOCUMENTS

| | | | | |
|---|---|---|---|---|
| CN | 101145434 A | | 3/2008 | |
| CN | 101295650 A | | 10/2008 | |
| CN | 101807625 A | | 8/2010 | |
| CN | 202887925 U | | 4/2013 | |
| CN | 104319042 A | | 1/2015 | |
| CN | 105427974 A | | 3/2016 | |
| CN | 105469954 A | | 4/2016 | |
| CN | 106929886 | * | 7/2017 | ............... C25D 1/04 |
| CN | 109256256 A | | 1/2019 | |
| CN | 109554730 | * | 4/2019 | ............... C25D 3/30 |
| CN | 110098042 A | | 8/2019 | |
| CN | 110565134 A | | 12/2019 | |
| KR | 10-2014-0067360 | | 6/2014 | |
| WO | WO-2009106269 A1 | * | 9/2009 | ............ C25D 17/28 |
| WO | WO-2017176237 A1 | * | 10/2017 | ........... C25D 11/026 |

\* cited by examiner

METHOD FOR PREPARING ELECTRODE OF INDUCTIVE COMPONENT

CROSS REFERENCE TO RELATED APPLICATIONS

The present application is a Continuation Application of PCT Application No. PCT/CN2020/119164 filed on Sep. 30, 2020, which claims the priority of Chinese Patent Application No. 201910953506.7 filed on Oct. 9, 2019. The contents of all of the above are hereby incorporated by reference.

BACKGROUND OF THE INVENTION

1. Field of the Invention

The present application relates to an electrode of an inductive component, and in particular, to a method for preparing an electrode of an inductive component.

2. Description of the Prior Art

Nowadays, electrode preparation of an inductive component mainly includes two methods: coating of conductive paste with electroplating nickel tin metal and vacuum sputtering metal ion deposition.

Traditional integrated inductors mostly use low-temperature conductive paste and then electroplated nickel-tin as external electrodes, but this electrode preparation technology has obvious disadvantages. Internal electrodes of the traditional integrated inductors are generally copper, and the low-temperature conductive paste is generally a resin material as a bonding matrix plus conductive metal powder. Therefore, the use of the resin material greatly reduces conductivity of conductive metal, and increases a contact resistance between the conductive metal powder and the internal electrodes of the component. This electrode preparation method has high costs, a complex process, poor precision, and poor thrust. The vacuum sputtering metal ion deposition process has high costs and low efficiency, and is only applicable to a thin electrode layer.

SUMMARY OF THE INVENTION

A technical problem to be resolved by the present application is to provide a method for preparing an electrode of an inductive component, so that a contact resistance and a thickness of an electrode layer can be effectively reduced, costs are reduced, and efficiency is improved, and a device and an apparatus are simple.

In order to resolve the above technical problem, the present application provides a method for preparing an electrode of an inductive component, including:

S1: performing surface insulation treatment, specifically including:

placing an inductive component in a spraying pot with a pot body angle of 45±20° C. and a rotating speed of 150±50 r/min, and performing thermal spraying on resin by using a fixed spray gun for surface insulation treatment, where a thermal spraying temperature is 80±30° C., a spraying time is 120±60 min, and a coating thickness of the resin is 0.010±0.005 mm;

S2: exposing an inner electrode, specifically including:

processing an electrode area through laser or mechanical polishing to expose the inner electrode, where a depth of the processing is 0.020±0.005 mm;

S3: performing surface pretreatment, specifically including:

performing degreasing and surface pretreatment with ultrasound in a special solution, where an ultrasonic time is not greater than 30 min;

S4: performing surface activation treatment, specifically including:

performing surface activation treatment with ultrasound in a low-concentration acid solution, where an ultrasound time is 30±10 s and an ultrasound temperature is 35±5° C.;

S5: electroplating to form a metal layer, specifically comprising:

S5.1: electroplating to form an electroplated copper layer, wherein a thickness of the electroplated copper layer is 0.010±0.004 mm;

S5.2: electroplating to form an electroplated nickel layer, wherein a thickness of the electroplated nickel layer is 0.003±0.002 mm, and a thickness of the electroplated tin layer is 0.004±0.002 mm; and S5.3: electroplating to form an electroplated tin layer, wherein a thickness of the electroplated tin layer is 0.004±0.002 mm; and S6: performing surface post-treatment, specifically including:

performing neutralization cleaning and anti-oxidation treatment first, then performing cleaning with pure water, and finally performing vacuum drying to complete preparation of an electrode of the inductive component.

The present application further provides an electrode of an inductive component, which is prepared by using the above method for preparing an electrode of an inductive component.

Compared to the prior art, the present application has the following beneficial effects.

1. In the present application, metal ions with metal the same as an internal electrode are deposited through electroplating, and a dense metal conductive layer may be formed to be connected to the internal electrode, thereby effectively reducing a contact resistance.

2. In the present application, a metal layer is directly electroplated, so that a thickness of an electrode layer can be effectively reduced, a space is saved for a magnet part of the component, and a high-density integration requirement of a PCB can be met.

3. In the present application, surface treatment is performed on the inductive component through a thermal spray resin process, so that a good insulating layer can be obtained, anti-oxidation, corrosion and plating resistance effects are achieved, and deposition of metal ions in a non-electrode area can be effectively avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

To describe the technical solutions of the embodiments of the present application more clearly, the following briefly introduces the accompanying drawings required for describing the embodiments. Apparently, the accompanying drawings in the following description show merely some embodiments of the present application, and a person skilled in the technology may still derive other drawings from these accompanying drawings without creative efforts.

1—Inductive component; 10—Resin; 15—Internal electrode; 30—Electroplated copper layer; 40—Electroplated nickel layer and Electroplated tin layer; 50—Bottom electrode; 60—End electrode; 70—L-type electrode.

DETAILED DESCRIPTION

The following clearly and completely describes the technical solutions in embodiments of the present application with reference to the accompanying drawings in the embodiments of the present application. Apparently, the described embodiments are merely some but not all of the embodiments of the present application. All other embodiments obtained by a person skilled in the art based on the embodiments of the present application without creative efforts shall fall within the protection scope of the present application.

Embodiment 1

Figure 1:
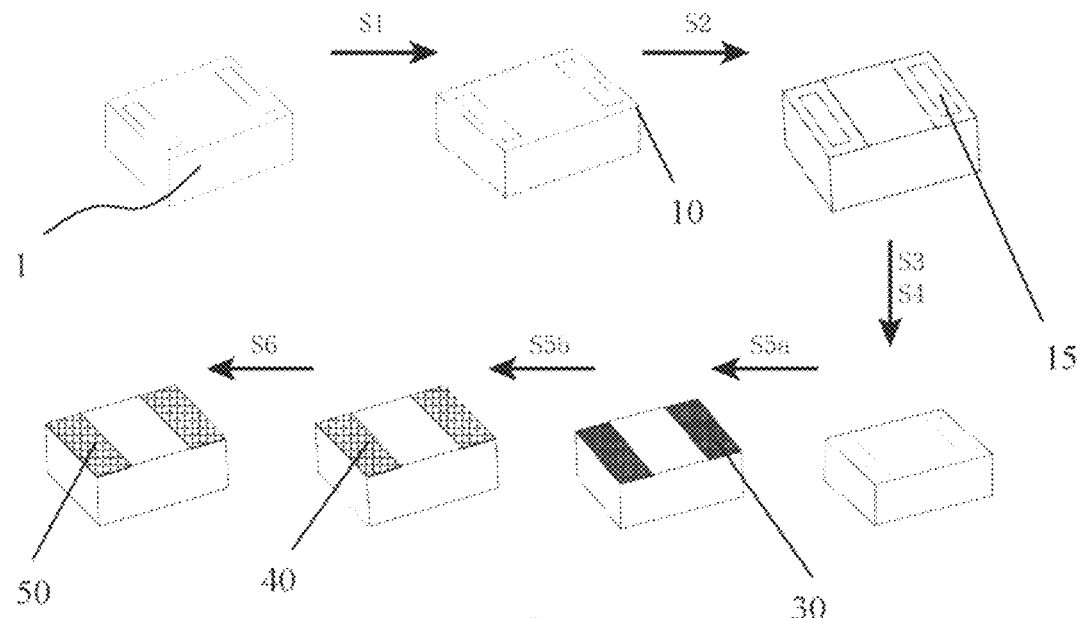
FIG. 1 is a flowchart of Embodiment 1 of the present application.

Referring to FIG. 1, the embodiment discloses a method for preparing an electrode of an inductive component, including:

S1: performing surface insulation treatment, specifically including:

placing an inductive component 1 in a spraying pot with a pot body angle of 45±20° C. and a rotating speed of 150±50 r/min, and performing thermal spraying on resin 10 by using a fixed spray gun for surface insulation treatment, where a thermal spraying temperature is 80±30° C., a spraying time is 120±60 min, and a coating thickness of the resin is 0.01±0.005 mm;

S2: exposing an inner electrode, specifically including:

processing an electrode area through laser or mechanical polishing to expose an inner electrode 15, where a depth of the processing is 0.020±0.005 mm;

S3: performing surface pretreatment, specifically including:

performing degreasing and surface pretreatment with ultrasound in a special solution, where an ultrasonic time is not greater than 30 min;

S4: performing surface activation treatment, specifically including:

performing surface activation treatment with ultrasound in a low-concentration acid solution, where an ultrasound time is 30±10 s and an ultrasound temperature is 35±5° C.;

S5: electroplating to form a metal layer, specifically including:

S5.1: electroplating to form an electroplated copper layer 30, where a thickness of the electroplated copper layer is 0.010±0.004 mm; and S5.2: electroplating to form an electroplated nickel layer and electroplated tin layer 40, where a thickness of the electroplated nickel layer is 0.003±0.002 mm, and a thickness of the electroplated tin layer is 0.004±0.002 mm; and S6: performing surface post-treatment, specifically including:

performing neutralization cleaning and anti-oxidation treatment first, then performing cleaning with pure water, and finally performing vacuum drying to complete preparation of an external electrode of the inductive component.

A preferred implementation of this embodiment

A method for preparing the electrode of the inductive component includes:

S1: performing surface insulation treatment, specifically including:

placing the inductive component 1 in the spraying pot with the pot body angle of 25° C. and a rotating speed of 100 r/min, and performing thermal spraying on resin 10 by using the fixed spray gun for surface insulation treatment, where the thermal spraying temperature is 50° C., the spraying time is 60 min, and the coating thickness of the resin is 0.005 mm;

S2: exposing the inner electrode, specifically including:

processing the electrode area through laser or mechanical polishing to expose the inner electrode 15, where the depth of the processing is 0.015 mm, and the exposed position of the inner electrode is on a bottom surface;

S3: performing surface pretreatment, specifically including:

performing degreasing and surface pretreatment with ultrasound in the special solution, where the ultrasonic time is 10 min;

S4: performing surface activation treatment, specifically including:

performing surface activation treatment with ultrasound in the low-concentration acid solution, where the ultrasound time is 20 s and the ultrasound temperature is 30° C.;

S5: electroplating to form the metal layer, specifically including:

S5.1: electroplating to form the electroplated copper layer 30, where the thickness of the electroplated copper layer is 0.006 mm; where:

an anode material for the electroplating is an electrolytic copper ball, and a cathode material for the electroplating is the inductive component;

an electrolyte for the electroplating is a mixed solution of a copper sulfate solution with a mass concentration of 140 g/L, a copper chloride solution with a mass concentration of 40 g/L, and a sulfuric acid with a mass concentration of 40 g/L; and performing electroplating in an electrolytic cell, where a current density is 2 A/dm$^2$, an electroplating time is 45 min, and an electroplating temperature is 440° C.; and S5.2: electroplating to form an electroplated nickel layer and electroplated tin layer 40, where the thickness of the electroplated nickel layer is 0.001 mm, and the thickness of the electroplated tin layer is 0.002 mm, where:

the electroplating to form the electroplated nickel layer specifically includes: an anode material for the electroplating is an electrolytic nickel ball, and a cathode material for the electroplating is the inductive component;

an electrolyte for the electroplating is a mixed solution of a nickel sulfamate solution with a mass concentration of 90 g/l, a nickel chloride solution with a mass concentration of 40 g/L, a boric acid solution with a mass concentration of 30 g/L, and a sulfamic acid with a mass concentration of 25 g/L; and performing electroplating in an electrolytic cell, where a current density is 3 A/dm$^2$, a electroplating time is 25 min, and a electroplating temperature is 50° C.; and the electroplating to form the electroplated tin layer specifically includes:

an anode material for the electroplating is an electrolytic tin ball, and a cathode material for the electroplating is the inductive component;

an electrolyte for the electroplating is a mixed solution of a stannous sulfate solution with a mass concentration of 45 g/L, and a sulfamic acid with a mass concentration of 40 g/L; and performing electroplating in the electrolytic cell, where a current density is 3 A/dm², an electroplating time is 15 min, and an electroplating temperature is 20° C.; and S6: performing surface post-treatment, specifically including:

performing neutralization cleaning and anti-oxidation treatment first, then performing cleaning with pure water, and finally performing vacuum drying to complete preparation of a bottom electrode 50 of the inductive component.

Embodiment 2

Figure 2:
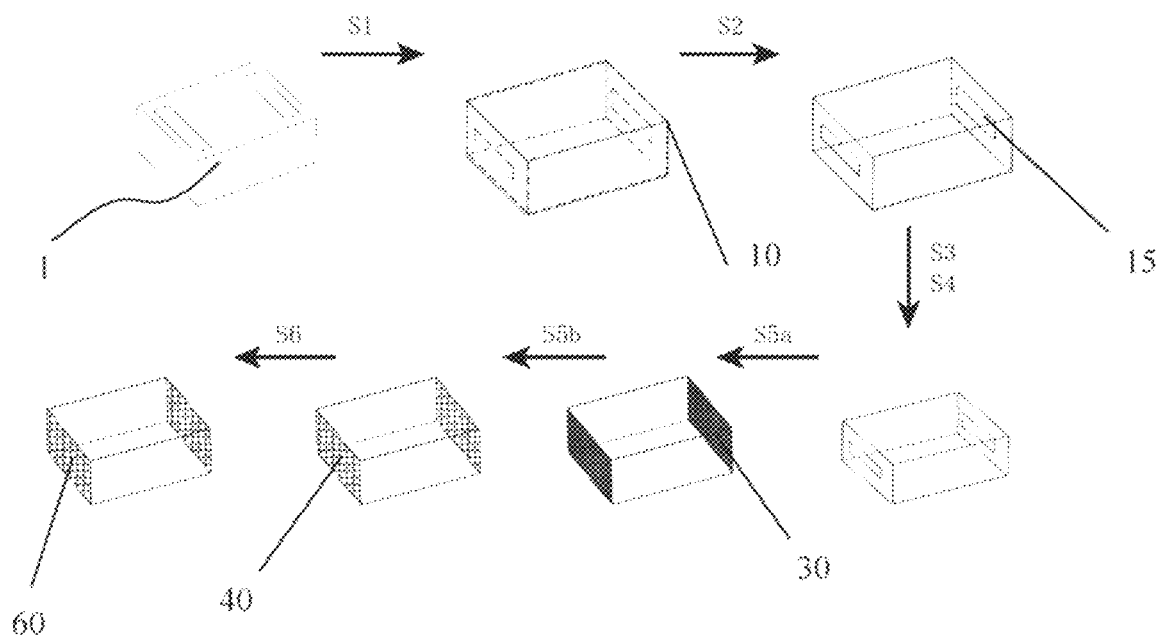
FIG. 2 is a flowchart of Embodiment 2 of the present application.

Referring to FIG. 2, the embodiment discloses a method for preparing an electrode of an inductive component, including:

S1: performing surface insulation treatment, specifically including:

placing an inductive component 1 in a spraying pot with a pot body angle of 45±20° C. and a rotating speed of 150±50 r/min, and performing thermal spraying on resin 10 by using a fixed spray gun for surface insulation treatment, where a thermal spraying temperature is 80±30° C., a spraying time is 120±60 min, the resin is one or more of epoxy resin, polyester resin, phenol resin, and amino resin, and a coating thickness of the resin is 0.010±0.005 mm; and with a specified angle and a specified rotating speed of the pot body, the inductive component can obtain omni-directional tumbling and stirring, and then the fixed spray gun is used for spraying, so that a surface of the inductive component is covered with a uniform resin layer, and while the resin layer is insulated and rust-proof, deposition of metal ions is effectively blocked in a non-electrode area during metal electrodeposition;

S2: exposing an inner electrode, specifically including:

processing an electrode area through laser or mechanical polishing to expose the inner electrode 15, where a depth of the processing is 0.020±0.005 mm, and an exposed position of the inner electrode is on an end surface;

S3: performing surface pretreatment, specifically including:

performing degreasing and surface pretreatment with ultrasound in a special solution (i.e. an alkaline solution), where the alkaline solution is a mixture of sodium hydroxide and ammonia, and an ultrasound time is not greater than 30 min;

S4: performing surface activation treatment, specifically including:

performing surface activation treatment with ultrasound in a low-concentration acid solution, where a mass fraction of the low-concentration acid solution is 0.5% to 3%, an ultrasonic time is 30±10 s, and an ultrasonic temperature is 35±5° C.;

S5: electroplating to form a metal layer, specifically including:

S5.1: electroplating to form an electroplated copper layer 30, where a thickness of the electroplated copper layer is 0.010±0.004 mm, where:

an anode material for the electroplating is an electrolytic copper ball or a pure copper plate, a cathode material for the electroplating is the inductive component, the inductive component is mounted in a corrosion-resistant and oxidation-resistant mesh appliance mixed with a metal steel ball as a conductive medium and is kept inclined and rotated at a constant speed during the electroplating;

an electrolyte for the electroplating is a mixed solution of a copper sulfate solution with a mass concentration of 150±10 g/L, a copper chloride solution with a mass concentration of 60±20 g/L, and a sulfuric acid with a mass concentration of 50±10 g/L; and performing electroplating in an electrolytic cell, where a current density is 3±1 A/dm², an electroplating time is 50±5 min, and an electroplating temperature is 45±5° C.; and S5.2: electroplating to form an electroplated nickel layer and electroplated tin layer 40, where a thickness of the electroplated nickel layer is 0.003±0.002 mm, and a thickness of the electroplated tin layer is 0.004±0.002 mm, where:

the electroplating to form the electroplated nickel layer specifically includes:

an anode material for the electroplating is an electrolytic nickel ball or a pure nickel plate, and a cathode material for the electroplating is the inductive component;

an electrolyte for the electroplating is a mixed solution of a nickel sulfamate solution with a mass concentration of 100±10 g/L, a nickel chloride solution with a mass concentration of 50±10 g/L, a boric acid solution with a mass concentration of 40±10 g/L, and a sulfamic acid with a mass concentration of 30±5 g/L; and performing electroplating in an electrolytic cell, where a current density is 4±1 A/dm², an electroplating time is 30±5 min, and an electroplating temperature is 55±5° C., and the electroplating to form the electroplated tin layer specifically includes:

an anode material for the electroplating is an electrolytic tin ball or a pure tin plate, and a cathode material for the electroplating is the inductive component;

an electrolyte for the electroplating is a mixed solution of a stannous sulfate solution with a mass concentration of 55±10 g/L, and a sulfamic acid with a mass concentration of 45±5 g/L; and performing electroplating in an electrolytic cell, where a current density is 6±3 A/dm², an electroplating time is 20±5 min, and an electroplating temperature is 25±5° C.; and S6: performing surface post-treatment, specifically including:

performing neutralization cleaning and anti-oxidation treatment first, then performing cleaning with pure water, and finally performing vacuum drying to complete the preparation of an end electrode 60 of the inductive component, where a solution for the neutralization cleaning is a buffer solution of sodium hydroxide and sodium carbonate, and a solution for the anti-oxidation treatment is a phosphate buffer solution.

A preferred implementation of this embodiment

A method for preparing the electrode of the inductive component includes:

S1: performing surface insulation treatment, specifically including:

placing the inductive component 1 in the spraying pot with the pot body angle of 45° C. and the rotating speed of 150 r/min, and performing thermal spraying on resin 10 by using the fixed spray gun for surface insulation treatment, where the thermal spraying temperature is 80° C., the spraying time is 120 min, and the coating thickness of the resin is 0.01 mm;

S2: exposing the inner electrode, specifically including:

processing an electrode area through laser or mechanical polishing to expose the inner electrode 15, where the depth of the processing is 0.02 mm, and the exposed position of the inner electrode is on an end surface;

S3: performing surface pretreatment, specifically including:

performing degreasing and surface pretreatment with ultrasound in the special solution, where the ultrasonic time is 10 min;

S4: performing surface activation treatment, specifically including:

performing surface activation treatment with ultrasound in the low-concentration acid solution, where the ultrasound time is 30 s and an ultrasound temperature is 35° C.;

S5: electroplating to form the metal layer, specifically including:

S5.1: electroplating to form the electroplated copper layer 30, where the thickness of the electroplated copper layer is 0.01 mm, where:

the anode material for the electroplating is the electrolytic copper ball, and the cathode material for the electroplating is the inductive component;

the electrolyte for the electroplating is the mixed solution of the copper sulfate solution with the mass concentration of 150 g/L, the copper chloride solution with the mass concentration of 60 g/L, and the sulfuric acid with the mass concentration of 50 g/L; and performing electroplating in the electrolytic cell, where the current density is 3 A/dm$^2$, the electroplating time is 50 min, and the electroplating temperature is 45° C.; and S5.2: electroplating to form an electroplated nickel layer and electroplated tin layer 40, where the thickness of the electroplated nickel layer is 0.003 mm, and the thickness of the electroplated tin layer is 0.004 mm, where:

the electroplating to form the electroplated nickel layer specifically includes:

the anode material for the electroplating is the electrolytic nickel ball, and the cathode material for the electroplating is the inductive component;

the electrolyte for the electroplating is the mixed solution of the nickel sulfamate solution with the mass concentration of 100 g/l, the nickel chloride solution with the mass concentration of 50 g/L, the boric acid solution with the mass concentration of 40 g/L, and the sulfamic acid with the mass concentration of 30 g/L; and performing electroplating in the electrolytic cell, where the current density is 4 A/dm$^2$, the electroplating time is 30 min, and the electroplating temperature is 55° C., and the electroplating to form the electroplated tin layer specifically includes:

the anode material for the electroplating is the electrolytic tin ball, and the cathode material for the electroplating is the inductive component;

the electrolyte for the electroplating is the mixed solution of the stannous sulfate solution with the mass concentration of 55 g/L, and the sulfamic acid with the mass concentration of 45 g/L; and performing electroplating in the electrolytic cell, where the current density is 6 A/dm$^2$, the electroplating time is 20 min, and the electroplating temperature is 25° C., and the electroplated metal layer can form a metal bond with the internal electrode to increase the push-pull reliability of welding; and S6: performing surface post-treatment, specifically including:

performing neutralization cleaning and anti-oxidation treatment first, then performing cleaning with pure water, and finally performing vacuum drying to complete the preparation of an end electrode 60 of the inductive component, where a solution for the neutralization cleaning is a buffer solution of sodium hydroxide and sodium carbonate, and a solution for the anti-oxidation treatment is a phosphate buffer solution.

Embodiment 3

Figure 3:
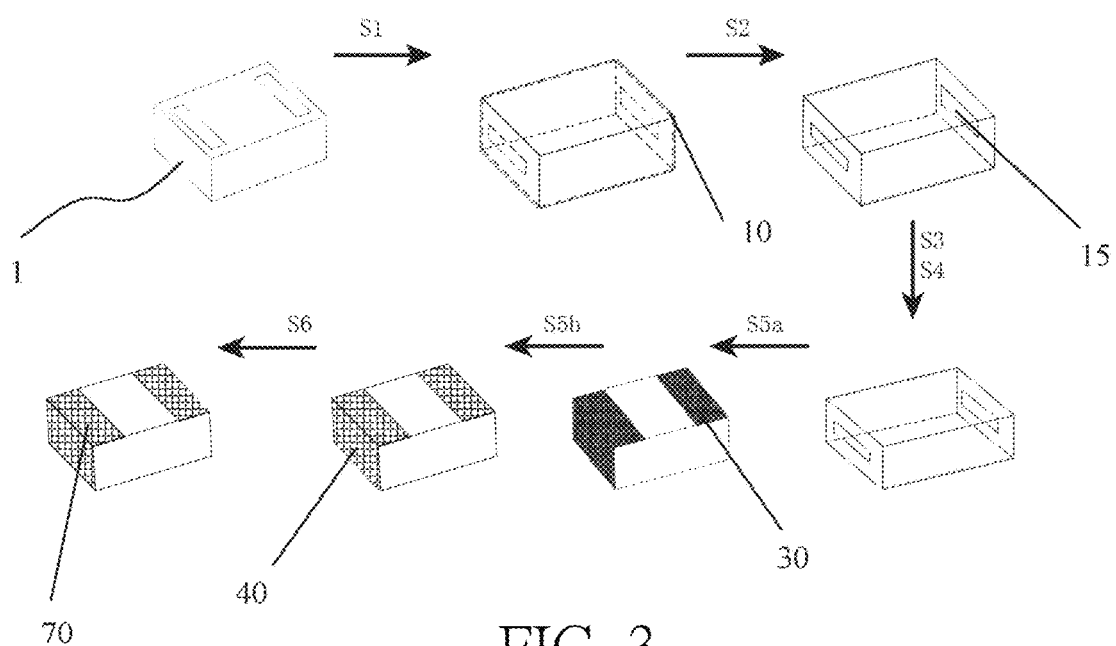
FIG. 3 is a flowchart of Embodiment 3 of the present application.

Referring to FIG. 3, the present embodiment discloses a method for preparing an electrode of an inductive component, including:

S1: performing surface insulation treatment, specifically including:

placing an inductive component 1 in a spraying pot with a pot body angle of 65° C. and a rotating speed of 200 r/min, and performing thermal spraying on resin 10 by using a fixed spray gun for surface insulation treatment, where a thermal spraying temperature is 110° C., a spraying time is 180 min, and a coating thickness of the resin is 0.015 mm;

S2: exposing an inner electrode, specifically including:

processing an electrode area through laser or mechanical polishing to expose the inner electrode 15, where a depth of the processing is 0.025 mm, and an exposed position of the inner electrode is on an end surface;

S3: performing surface pretreatment, specifically including:

performing degreasing and surface pretreatment with ultrasound in a special solution, where an ultrasonic time is 10 min;

S4: performing surface activation treatment, specifically including:

performing surface activation treatment with ultrasound in a low-concentration acid solution, where an ultrasound time is 35 s and an ultrasound temperature is 40° C.;

S5: electroplating to form a metal layer, specifically including:

S5.1: electroplating to form an electroplated copper layer, where a thickness of the electroplated copper layer is 0.014 mm, where:

an anode material for the electroplating is an electrolytic copper ball, and a cathode material for the electroplating is the inductive component;

an electrolyte for the electroplating is a mixed solution of a copper sulfate solution with a mass concentration of 160 g/L, a copper chloride solution with a mass concentration of 80 g/L, and a sulfuric acid with a mass concentration of 60 g/L; and performing electroplating in an electrolytic cell, where a current density is 4 A/dm$^2$, an electroplating time is 55 min, and an electroplating temperature is 50° C.;

S5.2: electroplating to form an electroplated nickel layer and electroplated tin layer 40, where a thickness of the electroplated nickel layer is 0.005 mm, and a thickness of the electroplated tin layer is 0.006 mm, where:

the electroplating to form the electroplated nickel layer specifically includes:

an anode material for the electroplating is an electrolytic nickel ball, and a cathode material for the electroplating is the inductive component;

an electrolyte for the electroplating is a mixed solution of a nickel sulfamate solution with a mass concentration of 110 g/L, a nickel chloride solution with a mass concentration of 60 g/L, a boric acid solution with a mass concentration of 50 g/L, and a sulfamic acid with a mass concentration of 35 g/L; and performing electroplating in an electrolytic cell, where a current density is 5 A/dm$^2$, an electroplating time is 35 min, and an electroplating temperature is 60° C.; and the electroplating to form the electroplated tin layer specifically includes:

an anode material for the electroplating is an electrolytic tin ball, and a cathode material for the electroplating is the inductive component;

an electrolyte for the electroplating is a mixed solution of a stannous sulfate solution with a mass concentration of 65 g/L, and a sulfamic acid with a mass concentration of 50 g/L; and performing electroplating in an electrolytic cell, where a current density is 9 A/dm$^2$, an electroplating time is 25 min, and an electroplating temperature is 30° C.; and S6: performing surface post-treatment, specifically including:

performing neutralization cleaning and anti-oxidation treatment first, then performing cleaning with pure water, and finally performing vacuum drying to complete the preparation of an L-shaped electrode 70 of the inductive component, where a solution for the neutralization cleaning is a buffer solution of sodium hydroxide and sodium carbonate, and a solution for the anti-oxidation treatment is a phosphate buffer solution.

The method for preparing an electrode of an inductive component provided in the present application includes the methods for preparing a bottom electrode, an end electrode, and an L-shaped electrode described in Embodiment 1, Embodiment 2, and Embodiment 3.

Electrodes in Embodiment 1, Embodiment 2, and Embodiment 3 are compared with electrodes of an inductive component 201610 prepared by two electrode preparation technologies: a coating of conductive paste with electroplating technology and a vacuum sputtering metal ion deposition technology. An inductance of the inductive component is 0.47 μH, an inner electrode is a copper wire, and a resistance is 25 mat. The results are shown in Table 1.

TABLE 1

Table of comparison between the embodiments of the present application and other electrode preparation technologies

| Electrode preparation technology | Resistance | Thickness of an electrode layer | Welding push-pull force |
|---|---|---|---|
| Coating of conductive paste with electroplating | 29 mΩ | 0.03 mm | 25N |
| Vacuum sputtering metal ion deposition | 25 mΩ | 0.015 mm | 30N |
| Embodiment 1 | 25 mΩ | 0.009 mm | 35N |
| Embodiment 2 | 26 mΩ | 0.017 mm | 34N |
| Embodiment 3 | 26 mΩ | 0.025 mm | 34N |

It can be learned from Table 1 that the preparation method of the embodiments of the present application can effectively reduce a DC resistance of the component, reduce a thickness of an electrode layer, and has good welding reliability.

A person skilled in the art can implement or use the present application according to the foregoing descriptions of the disclosed embodiments. Various modifications to these embodiments are obvious to a person skilled in the art, and the general principles defined in the present application may be implemented in other embodiments without departing from the spirit and scope of the present application. Therefore, the present application is not limited to these embodiments illustrated in the present application, but needs to conform to the broadest scope consistent with the principles and novel features disclosed in the present application.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method for preparing an electrode of an inductive component, comprising:

S1: performing surface insulation treatment, comprising:
placing the inductive component in a spraying pot with a pot body angle of 25-65° and a rotating speed of 100-200 r/min, and performing thermal spraying resin by using a fixed spray gun for performing surface insulation treatment, wherein a thermal spraying temperature is 50-110° C., a spraying time is 60-180 min, and a coating thickness of the resin is 0.005-0.015 mm;

S2: exposing an inner electrode, comprising:
processing an electrode area through laser or mechanical polishing to expose the inner electrode, wherein a depth of the processing is 0.015-0.025 mm;

S3: performing surface pretreatment, comprising:
performing degreasing and surface pretreatment with ultrasound in an alkaline solution, wherein an ultrasonic time is not greater than 30 min;

S4: performing surface activation treatment, comprising:
performing surface activation treatment with ultrasound in a low-concentration acid solution, wherein an ultrasound time is 20-40 s and an ultrasound temperature is 0-40° C.; wherein a mass fraction of the low-concentration acid solution in S4 is 0.5% to 3%;

S5: electroplating to form a metal layer, comprising:
S5.1: electroplating in an electrolytic cell to form an electroplated copper layer, wherein a thickness of the electroplated copper layer is 0.006-0.014 mm; wherein an anode material for the electroplating is an electrolytic copper ball or a pure copper plate, and a cathode material for the electroplating is the inductive component; an electrolyte for the electroplating is a mixed solution of a copper sulfate solution with a mass concentration of 140-160 g/L, a copper chloride solution with a mass concentration of 40-80 g/L, and a sulfuric acid with a mass concentration of 40-60 g/L; and a current density is 2-4 A/dm$^2$, an electroplating time is 45-55 min, and an electroplating temperature is 40-50° C.;

S5.2: electroplating in an electrolytic cell to form an electroplated nickel layer, wherein a thickness of the electroplated nickel layer is 0.001-0.005 mm; wherein an anode material for the electroplating is an electrolytic nickel ball or a pure nickel plate, and a cathode material for the electroplating is the inductive component; an electrolyte for the electroplating is a mixed solution of a nickel sulfamate solution with a mass concentration of 90-110 g/L, a nickel chloride solution with a mass concentration of 40-60 g/L, a boric acid solution with a mass concentration of 30-50 g/L, and a sulfamic acid with a mass concentration of 25-35 g/L; and a current density is 3-5 A/dm$^2$, an electroplating time is 25-35 min, and an electroplating temperature is 50-60° C.; and S5.3: electroplating in an electrolytic cell to form an electroplated tin layer, wherein a thickness of the electroplated tin layer is 0.002-0.006 mm; wherein an anode material for the electroplating is an electrolytic tin ball or a pure tin plate, and a cathode material for the electroplating is the inductive component; an electrolyte for the electroplating is a mixed solution of a stannous sulfate solution with a mass concentration of 45-65 g/L, and a sulfamic acid with a mass concentration of 40-50 g/L; and a current density is 3-9 A/dm$^2$, an electroplating time is 15-25 min, and an electroplating temperature is 20-30° C.; and S6: performing surface post-treatment, comprising:
performing neutralization cleaning and anti-oxidation treatment first, then performing cleaning with pure water, and finally performing vacuum drying to complete preparation of the electrode of the inductive component.

2. The method for preparing an electrode of an inductive component according to claim 1, wherein:
in S1, the pot body angle is 25°, the rotating speed is 100 r/min, the thermal spraying temperature is 50° C., the spraying time is 60 min, and the coating thickness of the resin is 0.005 mm;
in S2, the depth of the processing is 0.015 mm;
in S3, the ultrasonic time is 10 min; and
in S4, the ultrasound time is 20 s and the ultrasound temperature is 30° C.

3. The method for preparing an electrode of an inductive component according to claim 1, wherein:
in S1, the pot body angle is 45°, the rotating speed is 150 r/min, the thermal spraying temperature is 80° C., the spraying time is 120 min, and the coating thickness of the resin is 0.01 mm;
in S2, the depth of the processing is 0.02 mm;
in S3, the ultrasonic time is 10 min; and
in S4, the ultrasound time is 30 s and the ultrasound temperature is 35° C.

4. The method for preparing an electrode of an inductive component according to claim 1, wherein:
in S1, the pot body angle is 65°, the rotating speed is 200 r/min, the thermal spraying temperature is 110° C., the spraying time is 180 min, and the coating thickness of the resin is 0.015 mm;
in S2, the depth of the processing is 0.025 mm;
in S3, the ultrasonic time is 10 min; and
in S4, the ultrasound time is 20 s and the ultrasound temperature is 30° C.

5. The method for preparing an electrode of an inductive component according to claim 1, wherein the resin is one or more of epoxy resin, polyester resin, phenol resin, and amino resin.

6. The method for preparing an electrode of an inductive component according to claim 1, wherein:
in S5.1, the thickness of the electroplated copper layer is 0.006 mm, wherein the anode material for the electroplating is the electrolytic copper ball; the electrolyte for the electroplating is a mixed solution of a copper sulfate solution with the mass concentration of 140 g/L, a copper chloride solution with the mass concentration of 40 g/L, and the sulfuric acid with the mass concentration of 40 g/L; and the current density is 2 A/dm$^2$, the electroplating time is 45 min, and the electroplating temperature is 40° C.;
in S5.2, the thickness of the electroplated nickel layer is 0.001 mm, wherein the anode material for the electroplating is the electrolytic nickel ball; the electrolyte for the electroplating is the mixed solution of the nickel sulfamate solution with the mass concentration of 90 g/L, the nickel chloride solution with the mass concentration of 40 g/L, the boric acid solution with the mass concentration of 30 g/L, and the sulfamic acid with the mass concentration of 25 g/L; and the current density is 3 A/dm$^2$, the electroplating time is 25 min, and the electroplating temperature is 50° C.; and in S5.3, the thickness of the electroplated tin layer is 0.002 mm, wherein the anode material for the electroplating is the electrolytic tin ball; the electrolyte for the electroplating is the mixed solution of the stannous sulfate solution with the mass concentration of 45 g/L, and the sulfamic acid with the mass concentration of 40 g/L; and the current density is 3 A/dm$^2$, the electroplating time is 15 min, and the electroplating temperature is 20° C.

7. The method for preparing an electrode of an inductive component according to claim 1, wherein:
in S5.1, the thickness of the electroplated copper layer is 0.01 mm, wherein the anode material for the electroplating is the electrolytic copper ball; the electrolyte for the electroplating is a mixed solution of a copper sulfate solution with the mass concentration of 150 g/L, a copper chloride solution with the mass concentration of 60 g/L, and the sulfuric acid with the mass concentration of 50 g/L; and the current density is 3 A/dm$^2$, the electroplating time is 50 min, and the electroplating temperature is 45° C.;
in S5.2, the thickness of the electroplated nickel layer is 0.003 mm, wherein the anode material for the electroplating is the electrolytic nickel ball; the electrolyte for the electroplating is the mixed solution of the nickel sulfamate solution with the mass concentration of 100 g/L, the nickel chloride solution with the mass concentration of 50 g/L, the boric acid solution with the mass concentration of 40 g/L, and the sulfamic acid with the mass concentration of 30 g/L; and the current density is 4 A/dm$^2$, the electroplating time is 30 min, and the electroplating temperature is 55° C.; and
in S5.3, the thickness of the electroplated tin layer is 0.004 mm, wherein the anode material for the electroplating is the electrolytic tin ball; the electrolyte for the electroplating is the mixed solution of the stannous sulfate solution with the mass concentration of 55 g/L, and the sulfamic acid with the mass concentration of 45 g/L; and the current density is 6 A/dm$^2$, the electroplating time is 20 min, and the electroplating temperature is 25° C.

8. The method for preparing an electrode of an inductive component according to claim 1, wherein:
in S5.1, the thickness of the electroplated copper layer is 0.014 mm, wherein the anode material for the electroplating is the electrolytic copper ball; the electrolyte for the electroplating is a mixed solution of a copper sulfate solution with the mass concentration of 160 g/L, a copper chloride solution with the mass concentration of 80 g/L, and the sulfuric acid with the mass concentration of 60 g/L; and the current density is 4 A/dm$^2$, the electroplating time is 55 min, and the electroplating temperature is 50° C.;
in S5.2, the thickness of the electroplated nickel layer is 0.005 mm, wherein the anode material for the electroplating is the electrolytic nickel ball; the electrolyte for the electroplating is the mixed solution of the nickel sulfamate solution with the mass concentration of 110 g/L, the nickel chloride solution with the mass concentration of 60 g/L, the boric acid solution with the mass concentration of 50 g/L, and the sulfamic acid with the mass concentration of 35 g/L; and the current density is 5 A/dm$^2$, the electroplating time is 35 min, and the electroplating temperature is 60° C.; and
in S5.3, the thickness of the electroplated tin layer is 0.006 mm, wherein the anode material for the electroplating is the electrolytic tin ball; the electrolyte for the electroplating is the mixed solution of the stannous sulfate solution with the mass concentration of 65 g/L, and the sulfamic acid with the mass concentration of 50 g/L; and the current density is 9 A/dm$^2$, the electroplating time is 25 min, and the electroplating temperature is 30° C.

9. The method for preparing an electrode of an inductive component according to claim 1, wherein the inductive component is mounted in a corrosion-resistant and oxidation-resistant mesh appliance mixed with a metal steel ball as a conductive medium and is kept inclined and rotated at a constant speed during the electroplating.

10. The method for preparing an electrode of an inductive component according to claim 1, wherein a solution for the neutralization cleaning in S6 is a buffer solution of sodium hydroxide and sodium carbonate, and a solution for the anti-oxidation treatment is a phosphate buffer solution.

\* \* \* \* \*